United States Patent [19]

Yada

[11] Patent Number: 5,461,336

[45] Date of Patent: Oct. 24, 1995

[54] FILTER CIRCUIT

[75] Inventor: Toshiro Yada, Itami, Japan

[73] Assignee: Mitsubishi Denki Kabushiki Kaisha, Tokyo, Japan

[21] Appl. No.: 219,459

[22] Filed: Mar. 29, 1994

[51] Int. Cl.[6] .................................. H03K 5/00; H03B 1/00
[52] U.S. Cl. ............................. 327/553; 327/317; 330/305
[58] Field of Search ..................................... 330/107, 109, 330/303, 305, 257; 327/551, 558, 553, 52, 53, 310, 311, 315, 317

[56] References Cited

U.S. PATENT DOCUMENTS 5,028,884  7/1991  Kondo et al. ........................ 330/306

FOREIGN PATENT DOCUMENTS 2-268507  11/1990  Japan.

OTHER PUBLICATIONS

A Theses from the National Convention of Television Society, 1986, Y. Okada, et al., "Luminance Signal LSI of Adjustment–Free Filters for VTR".

*Primary Examiner*—Timothy P. Callahan
*Assistant Examiner*—Dinh T. Le
*Attorney, Agent, or Firm*—Oblon, Spivak, McClelland, Maier, & Neustadt

[57] ABSTRACT

There is disclosed a filter circuit wherein a current control portion (12) controls a constant current ($I_2$) specifying the sum of currents flowing in transistors (T119, T120) of a control portion (11) and transistors (T19, T20) of a control portion (9) on the basis of a potential difference between an output voltage ($V_1$) of an operational amplifier (7) and a constant voltage ($V_3$) whereby, if there is a difference in voltage level between a control voltage ($V_2$) of the control portion (9) and the constant voltage ($V_3$) of the control portion (11), a filter control portion performs the same control as a reference filter output characteristic of a filter portion (8) to an ideal input-output characteristic.

14 Claims, 14 Drawing Sheets

5,461,336

FILTER CIRCUIT

BACKGROUND OF THE INVENTION

1. Field of the Invention

The present invention relates to a filter circuit and, more particularly, to a filter circuit with an automatic regulating function which is adapted to provide a constant input-output characteristic independent of variations in values of elements when fabricated.

2. Description of the Background Art

Elements of the same type formed in one semiconductor integrated circuit are characterized by a substantially constant variation tendency of their characteristic values such as resistances and capacitances when fabricated. A circuit arrangement making use of this property can prevent the variations in element characteristic values in the circuit from being reflected upon variations in circuit characteristics.

The absolute values of the element characteristic values sometimes vary when the elements are fabricated, and there is no correlation between variation tendencies of different types of elements. For example, in a filter circuit whose characteristics are determined by a resistance and a capacitance, the variations in values of elements when fabricated result in variations in characteristics of the filter circuit itself.

FIG. 8 is a circuit diagram of an example of conventional integrated filter circuits. As shown in FIG. 8, the filter circuit comprises a filter portion 8 and a control portion 9. FIG. 9 is a circuit diagram schematically showing the internal construction of the filter portion 8.

Referring to FIG. 9, the filter portion 8 includes a voltage-controlled current source 13 having a mutual conductance gm, a capacitor $C_1$, and a buffer 14. The filter portion 8 receives an input signal $v_{in}$ given from an input signal source 51 through an input terminal 1 and filters the input signal $v_{in}$ on the basis of RC characteristics set therein to output an output signal $v_{out}$ at an output terminal 2.

The voltage-controlled current source 13 includes PNP bipolar transistors T1, T2, NPN bipolar transistors T10 to T15, and reference current sources 81, 82 for supplying a reference current $I_1$, as shown in FIG. 8. The transistors T10 and T11 form a differential pair. The input signal $v_{in}$ is applied to the base of the transistor T10, and the output terminal 2 is connected to the base of the transistor T11. The emitter of the transistor T10 is grounded through the reference current source 81, and the emitter of the transistor T11 is grounded through the reference current source 82. A resistor $R_1$ is connected between the emitters of the transistors T10 and T11. The reference current sources 81, 82 specify the sum of the amounts of current flowing in the transistors T10 and T11.

The transistors T1, T2, T12 to T15 form a load current control portion. The transistors T1, T12, T13 control the collector current of the transistor T10, and the transistors T2, T14, T15 control the collector current of the transistor T11. The transistors T1 and T2 form a current mirror circuit. The transistors T1 and T2 are of the same transistor size, the transistors T12 to T15 are of the same transistor size, and the transistors T10 and T11 are of the same transistor size.

The voltage-controlled current source 13 as above constructed includes a differential amplifier circuit having the differential pair of transistors T10 and T11, the base input of the transistor T10 serving as a positive input of the voltage-controlled current source 13, the base input of the transistor T11 serving as a negative input thereof, the collector of the transistor T15 at a node N1 serving as the output thereof. The voltage-controlled current source 13 supplies an output current $I_{16}$ at its output on the basis of a potential difference between the positive and negative inputs thereof. The capacitor $C_1$ is connected between the node N1 which is the output of the voltage-controlled current source 13 and ground.

The buffer 14 includes an NPN bipolar transistor T3, a diode D1 and a reference current source 83 connected in series between a power supply $V_{cc}$ and ground, as shown in FIG. 8. The base of the transistor T3 is connected to the output node N1 of the voltage-controlled current source 13 and a first electrode of the capacitor $C_1$. A voltage given from the cathode of the diode D1 at a node N2 serves as the output voltage $v_{out}$, which is outputted at the output terminal 2 and is applied to the base input of the transistor T11.

That is, the filter portion 8 is of a negative feedback arrangement which receives the input signal $v_{in}$ at positive input and receives the output voltage $v_{out}$ of the buffer 14 at negative input.

The control portion 9 includes NPN bipolar transistors T17 to T20, a reference voltage source 91 for generating a reference voltage $V_1$, and reference current sources 92, 93 for supplying a reference current $I_2$.

The transistors T19 and T20 form a differential pair. The reference voltage $V_1$ is applied to the base of the transistor T19 from the reference voltage source 91, and a reference control voltage $V_2$ is applied to the base of the transistor T20 from an exterior reference voltage source 90 through a terminal 3.

The transistors T17, T18 have bases commonly receiving a predetermined reference voltage from a reference voltage source 94, collectors connected commonly to the power supply $V_{cc}$, and emitters connected to the collectors of the transistors T19, T20, respectively, and serve as a load current control portion.

The emitter of the transistor T19 is grounded through the reference current source 92, and the emitter of the transistor T20 is grounded through the reference current source 93. A resistor $R_2$ is connected between the emitters of the transistors T19 and T20. The reference current sources 92 and 93 control the sum of the amounts of current flowing in the transistors T19 and T20.

The collector of the transistor T19 at a node N11 is connected to the bases of the transistors T12 and T14 of the voltage-controlled current source 13, and the collector of the transistor T20 at a node N12 is connected to the bases of the transistors T13 and T15 of the voltage-controlled current source 13.

The input-output characteristic of the filter circuit of FIGS. 8 and 9 is basically determined by the resistance and capacitance of the resistor $R_1$ and capacitor $C_1$ in the voltage-controlled current source 13 and may be changed by the control circuit 9. The characteristic of the filter circuit will now be derived with reference to FIG. 9.

$$I = gm(V_{in} - V_{out}) \tag{1}$$

where gm is a mutual conductance of the voltage-controlled current source 13, I is the value of the output current $I_{16}$ of the voltage-controlled current source 13, C is the capacitance of the capacitor $C_1$, $V_{in}$ is the signal level of the input signal $v_{in}$, and $V_{out}$ is the level of the output voltage $v_{out}$.

$$V_{out} = \frac{I}{j\omega C} \quad (2)$$

Then, I is eliminated from Expressions (1) and (2) to find the input-output characteristics of the voltage-controlled current source 13.

$$G = \frac{V_{out}}{V_{in}} = \frac{gm}{gm + j\omega C} \quad (3)$$

A cut-off frequency $f_c$ of the filter is determined from Expression (3).

$$f_c = \frac{gm}{2\pi C} \quad (4)$$

As shown in FIG. 8, the filter portion 8 is formed in such a manner that the capacitor $C_1$ is added to the voltage-controlled current source 13 including the differential amplifier circuit. The voltage-controlled current source 13 is adapted so that the output current $I_{16}$ changes in accordance with a potential difference between the input level $V_{in}$ of the input signal source 51 and the output level $V_{out}$ of the output terminal 2. The mutual conductance gm of the voltage-controlled current source 13 may be controlled by the exterior constant voltage source $V_2$ connected to the terminal 3, as will be described below.

$$\frac{I_{13}}{I_{12}} = \frac{I_{15}}{I_{14}} = \frac{I_{17}}{I_{18}} \quad (5)$$

$$I_{12} + I_{13} = I_{10} \quad (6)$$

$$I_{14} + I_{15} = I_{11} \quad (7)$$

where $I_{10}$ to $I_{15}$ are collector current values of the transistors T10 to T15, and $I_{17}$ and $I_{18}$ are collector current values of the transistors T17 and T18, respectively.

Changing Expressions (5) to (7) into $$I_{13} = \frac{I_{17}}{I_{17} + I_{18}} \cdot I_{10} \quad (8)$$

$$I_{15} = \frac{I_{17}}{I_{17} + I_{18}} \cdot I_{11} \quad (9)$$

Further $$I_{16} = I_{13} - I_{15} = \left( \frac{I_{17}}{I_{17} + I_{18}} \right)(I_{10} - I_{11}) \quad (10)$$

The following expressions hold $$I_{10} = I_1 + \frac{V_{in} - V_{out}}{R_1} \quad (11)$$

$$I_{11} = I_1 - \frac{V_{in} - V_{out}}{R_1} \quad (12)$$

$$I_{17} = I_2 + \frac{V_1 - V_2}{R_2} \quad (13)$$

$$I_{18} = I_2 - \frac{V_1 - V_2}{R_2} \quad (14)$$

where $R_1$ is the resistance of the resistor $R_1$, and $R_2$ is the resistance of the resistor $R_2$.

Inserting Expressions (11) to (14) into Expression (10), Expression (15) holds. The mutual conductance gm is determined by Expression (16).

$$I_{16} = \frac{1}{R_1} \left( 1 + \frac{V_1 - V_2}{I_2 R_2} \right)(V_{in} - V_{out}) \quad (15)$$

$$gm = \frac{1}{R_1} \left( 1 + \frac{V_1 - V_2}{I_2 R_2} \right) \quad (16)$$

From Expression (16), it is understood that the mutual conductance gm of the voltage-controlled current source 13 is controlled by the control voltage $V_2$ given from the terminal 3. A cut-off frequency $f_8$ which is the input-output characteristic of the filter circuit is determined from Expression (4) if the mutual conductance gm and the capacitance are determined. Then Expression (17) holds.

$$f_8 = \frac{1}{2\pi C_1 R_1} \left( 1 + \frac{V_1 - V_2}{I_2 R_2} \right) \quad (17)$$

It will be appreciated from Expression (17) that the input-output characteristic of the filter circuit is changed by the control voltage $V_2$ given from the exterior. Thus, the variations in input-output characteristic of the filter circuit may be controlled by adjusting the value of the control voltage $V_2$ if the absolute values of the elements when fabricated vary within a variable range of the filter portion 8 and the control portion 9.

However, for practical mass production of products in which such a filter circuit is mounted, it is necessary to adjust a control voltage corresponding to the control voltage $V_2$ for each of the products, resulting in increased costs which is impractical.

To solve the problem, it has been considered to provide an automatic regulating circuit for keeping the characteristic of the circuit itself constant independent of variations in characteristic values of the elements when fabricated.

FIGS. 10A and 10B are a circuit diagram of an example of conventional filter circuits with an automatic regulating function. As shown in FIGS. 10A and 10B, the filter circuit comprises a reference signal source 4, an amplitude detector 5, an amplitude detector 6, an operational amplifier 7, a resistor $R_4$, a resistor $R_5$, a reference filter portion 10, and a control portion 11 as well as the filter portion 8 and the control portion 9. The filter portion 8 and the control portion 9 of FIGS. 10A and 10B are similar in construction to those of FIG. 8 except that the base input of the transistor T19 of the control portion 9 receives the output voltage $V_1$ of the operational amplifier 7, and the description thereof will be omitted herein.

The amplitude detectors 5 and 6 have completely the same characteristic, and the operational amplifier 7 has a sufficiently large gain. A reference signal S4 generated by the reference signal source 4 uses a sine wave having constant amplitude and frequency. The reference signal S4 is applied to the reference filter portion 10 and is dammed by the resistors $R_4$ and $R_5$ at a predetermined rate into a damped signal S45 which is in turn applied to the amplitude detector 6.

The amplitude detector 5 receives an output signal S10 and applies an output signal S5 to a negative input of the operational amplifier 7. The amplitude detector 6 receives the damped signal S45 and applies an output signal S6 to a positive input of the operational amplifier 7. The operational amplifier 7 outputs the control voltage $V_1$ on the basis of a potential difference between the two signals S5 and S6.

The reference filter portion 10 is equivalent in construction to the filter portion 8, and includes transistors T101 to T103 corresponding to the transistors T1 to T3, transistors T111 to T115 corresponding to the transistors T10 to T15, a reference current source 103 corresponding to the reference current source 83, and a diode D101 corresponding to the diode D1. The above-mentioned respective corresponding elements have completely the same individual size and characteristic as well as the same connection to their peripheral portions. Nodes N101 and N102 correspond to the nodes N1 and N2, respectively.

The resistor $R_3$ corresponds to the resistor $R_1$, and the capacitor $C_2$ corresponds to the capacitor $C_1$. Reference current sources 101, 102 correspond to the reference current sources 81, 82, respectively, and specify the sum of the amounts of current flowing in the transistors T111 and T111. The abovementioned respective corresponding elements have the same connection to their peripheral portions but have different individual characteristic values such as resistances, capacitances, and supply current values.

The control portion 11 is equivalent in construction to the control portion 9, and includes transistors T117 to T120 corresponding to the transistors T17 to T20, a resistor $R_2$ corresponding to the resistor $R_2$ (designated by the same reference character to manifest the same resistance), reference current sources 112, 113 corresponding to the reference current sources 92, 93 for specifying the sum of the amounts of current flowing in the transistors T119, T120, and a reference voltage source 104 corresponding to the reference voltage source 94. The above-mentioned respective corresponding elements have completely the same individual size and characteristic as well as the same connection to their peripheral portions. Nodes N111 and N112 correspond to the nodes N11 and N12, respectively. The control portion 11 differs from the control portion 9 only in that a constant voltage $V_3$ is applied to the base of the transistor T120 from a reference voltage source 105.

Connection between the reference filter portion 10 and the control portion 11 is equivalent to connection between the filter portion 8 and the control portion 9 of FIG. 8 except that the output voltage $V_1$ of the operational amplifier 7 is applied to the bases of the transistors T19 and T119 of the control portions and 11.

The resistance and capacitance of the resistor $R_3$ and capacitor $C_2$ of the reference filter portion 10 are selected to provide an input-output characteristic which damps the reference signal S4 to $(R_5/(R_4+R_5))$ times when the control voltage applied to the reference filter portion 10 from the control circuit 11 is in the middle of the control range, that is, when the output voltage $V_1$ of the operational amplifier 7 is equal to the constant voltage $V_3$. The operational amplifier 7 is set so that the output voltage $V_1$ equals the constant voltage $V_3$ when positive and negative phase input voltages are equal.

Above-mentioned setting enables the operational amplifier 7 to receive equal voltages (S5, S6) when the signals (S10, S45) of the same amplitude are applied to the amplitude detectors 5, 6. The result is $V_1=V_3$, and the damping factor of the reference filter portion 10 is kept to $(R_5/(R_4+R_5))$, whereby the amplitude of the signal S45 damped by the resistors $R_4$ and $R_5$ equals that of the filtered output signal S10 of the reference filter portion 10. In this manner, a feedback loop is formed between the reference filter portion 10 and the control circuit 11. A cut-off frequency $f_{10}$ of the reference filter portion 10 is expressed by Expression (18) in the same manner as Expression (17).

$$f_{10} = \frac{1}{2\pi C_2 R_3} \left( 1 + \frac{V_1 - V_3}{I_2 R_2} \right) \quad (18)$$

If the element values of resistances and capacitances vary depending on variations in values of elements when fabricated, an attenuator including resistors $R_4$ and $R_5$ has a constant resistance ratio and, accordingly, the damping factor is not changed, but the input-output characteristic of the reference filter portion 10 varies. For example, when the cut-off frequency $f_{10}$ decreases, the amount of attenuation by the filter increases and the output voltage S5 of the amplitude detector 5 decreases.

As a result, the output voltage $V_1$ of the operational amplifier 7 increases. Thus the cut-off frequency $f_{10}$ increases from Expression (18) to provide negative feedback. At this time, since the operational amplifier 7 has a sufficiently large gain, the control circuit 11 operates to compensate for any slight variations in the amount of attenuation by the filter. The amount of attenuation is thus kept constant at all times. Since the filter portion 8 and the control portion 9 are equivalent to the reference filter portion 10 and the control circuit 11 as above discussed, the control portion 9 performs similar control on the filter portion 8.

A desired value of the input-output characteristic of the filter portion 8 is provided by selecting the values of the resistor $R_1$ and capacitor $C_1$. The output voltage $V_1$ applied to the control circuit 9 is common to the control circuit 11, and controls the characteristic variations when the individual element values of the filter portion 8 vary. Accordingly, the cut-off frequency of the filter portion 8 is determined by $$f_8 = \frac{1}{2\pi C_1 R_1} \left( 1 + \frac{V_1 - V_2}{I_2 R_2} \right) \quad (19)$$

Assuming that $R_1=a\ R_3$, $C_1=b\ C_2$, Expression (19) is changed into $$f_8 = \frac{1}{2\pi ab C_2 R_3} \left( 1 + \frac{V_1 - V_2}{I_2 R_2} \right) = \frac{1}{ab} f_{10} + \frac{V_3 - V_2}{2\pi ab C_2 I_2 R_2 R_3} \quad (20)$$

Symbols such as I and R are asterisked at upper right to indicates that the element values have varied (except the constant voltages such as $V_2$ and $V_3$ because they are easily designed not to vary). The cut-off frequency $f_8$ of the filter portion 8 when varied is expressed by $$f_8^* = \frac{1}{ab} f^*_{10} + \frac{V_3 - V_2}{2\pi ab C_2^* I_2^* R_2^* R_3^*} \quad (21)$$

where $$f_{10}^* = \frac{1}{2\pi C_2^* R_3^*} \left( 1 + \frac{V_1^* - V_3}{I_2^* R_2^*} \right) \quad (22)$$

The reference filter portion 10 has a characteristic kept constant at all times by automatic change of the output voltage $V_1$ of the operational amplifier 7 if the individual element values vary. Then Expression (23) holds.

$$f_{10}^* = f_{10}$$

Expression (24) is derived from Expression (21).

$$f_8^* = \frac{1}{ab} f_{10} + \frac{V_3 - V_2}{2\pi ab C_2^* I_2^* R_2^* R_3^*} \quad (24)$$

From Expression (24), it is found that when $V_2=V_3$ the cut-off frequency $f_8$ of the filter portion 8 is $(1/ab)\cdot f_{10}$ which is constant at all times and is not influenced by variations in the element values in the filter portion 8. However, when $V_2 \neq V_3$, the following inequality is derived from comparison between Expressions (20) and (24).

$$C_2^* I_2^* R_2^* R_3^* \neq C_2 I_2 R_2 R_3 \quad (25)$$

Accordingly, the conclusion is $f_8 \neq f_8^*$. It is easy to design semiconductor integrated circuits so that current values such as $I_2$, $I_3$ are inversely proportional to the resistances such as $R_2$, $R_3$, and accordingly Expression (26) holds.

$$I_2^* R_2^* = I_2 R_2 \quad (26)$$

Expression (25) is then simplified as $$C_2^* R_3^* \neq C_2 R_3 \quad (27)$$

However, the capacitances and resistances vary independently of each other, resulting in $f_8 \neq f_8^*$.

The conventional filter circuit with automatic regulating function as above designed presents no problems when $V_2=V_3$ but has been disadvantageous in that, when $V_2 \neq V_3$, variations in element values cause variations in input-output characteristic thereof if it is desired to obtain some characteristics by some changes of the value of $V_2$ in a single filter circuit.

SUMMARY OF THE INVENTION

According to the present invention, a filter circuit comprises: an input terminal receiving an input signal, an output terminal, an input-output characteristic control terminal receiving a control voltage, a filter portion including a first differential amplifier circuit connected to the input terminal and the output terminal and having a differential pair of first and second transistors and a first constant current source for specifying the sum of currents flowing in the first and second transistors, and first and second characteristic determining elements for specifying a first input-output characteristic, the filter portion receiving the input signal at a control electrode of one of the first and second transistors and filtering the input signal on the basis of the first input-output characteristic to output a first filtered signal at the output terminal, a reference filter portion including a second differential amplifier circuit having a differential pair of third and fourth transistors and a second constant current source for specifying the sum of currents flowing in the third and fourth transistors, and third and fourth characteristic determining elements for specifying a second input-output characteristic, the reference filter portion receiving a predetermined reference signal at an control electrode of one of the third and fourth transistors and filtering the predetermined reference signal on the basis of the second input-output characteristic to output a second filtered signal, the second differential amplifier circuit being equivalent in construction to the first differential amplifier circuit, the third and fourth transistors being similar in construction to the first and second transistors, the third characteristic determining element and the first characteristic determining element being of the same type, the fourth characteristic determining element and the second characteristic determining element being of the same type, difference amount detecting means for comparing the second filtered signal with the predetermined reference signal to output a difference amount detection voltage indicative of the amount of difference between the second input-output characteristic of the reference filter portion and an ideal input-output characteristic desired when designed, a reference filter control portion including a third differential amplifier circuit having a differential pair of fifth and sixth transistors and a third constant current source for specifying the sum of currents flowing in the fifth and sixth transistors, the reference filter control portion receiving the difference amount detection voltage and a predetermined reference voltage at control electrodes of the fifth and sixth transistors, respectively, and controlling the second input-output characteristic of the reference filter portion so that the difference amount detection voltage equals the reference voltage, the reference voltage being set to a level of the difference amount detection voltage at the time of the amount of difference indicating "0", a filter control portion including a fourth differential amplifier circuit connected to the input-output characteristic control terminal and having a differential pair of seventh and eighth transistors and a fourth constant current source for specifying the sum of currents flowing in the seventh and eighth transistors, the filter control portion receiving the difference amount detection voltage and the control voltage at control electrodes of the seventh and eighth transistors, respectively, and controlling the first input-output characteristic of the filter portion so that the difference amount detection voltage equals the control voltage, the fourth differential amplifier circuit being equivalent in construction to the third differential amplifier circuit, the seventh and eighth transistors being similar in construction to the fifth and sixth transistors, respectively, and a current control portion including a fifth differential amplifier circuit having a differential pair of ninth and tenth transistors and a fifth constant current source for specifying the sum of currents flowing in the ninth and tenth transistors, the current control portion receiving the difference amount detection voltage and the reference voltage at control electrodes of the ninth and tenth transistors, respectively, and controlling the amount of supply current of both the third and fourth constant current sources on the basis of a potential difference between the difference amount detection voltage and the reference voltage, the fifth differential amplifier circuit being equivalent in construction to the third differential amplifier circuit, the ninth and tenth transistors being similar in construction to the fifth an sixth transistors, respectively, the filter portion, the reference filter portion, the difference amount detecting means, the reference filter control portion, the filter control portion, and the current control portion being integrally formed on the same semiconductor chip.

The filter circuit of the present invention, which has the respective components formed on the same semiconductor chip, has similar tendency of variations in element values such as resistances and capacitances of the first and third characteristic determining elements which are of the same type when the elements are fabricated and similar tendency of variations in element values of the second and fourth characteristic determining elements.

The filer control portion controls the first input-output characteristic of the filter portion in the same manner as the reference filter control portion controlling the second input-output characteristic for the reference filter, to adjust the first input-output characteristic to the ideal input-output characteristic.

The control electrodes of the seventh and eighth transistors of the filter control portion receive the difference amount detection voltage and the control voltage, respectively, and the control electrodes of the fifth and sixth transistors of the reference filter control portion receive the difference amount detection voltage and the reference voltage, respectively. In some cases, the first input-output characteristic is not necessarily adjusted to the ideal input-output characteristic because of difference in voltage level between the control voltage and the reference voltage if the filter control portion performs the same control as the reference filter control portion. The current control portion controls the amount of supply current of both the third constant current source of the reference filter control portion and the fourth constant current source of the filter control portion on the basis of the potential difference between the difference amount detection voltage and the reference voltage. This enables the filter control portion to perform the same control as the reference filter control portion to adjust the first input-output characteristic to the ideal input-output characteristic if there is a difference in voltage level between the control voltage and the reference voltage.

It is an object of the present invention to provide a filter circuit with automatic regulating function which provides a constant input-output characteristic if values of elements when fabricated vary.

These and other objects, features, aspects and advantages of the present invention will become more apparent from the following detailed description of the present invention when taken in conjunction with the accompanying drawings.

DESCRIPTION OF THE PREFERRED EMBODIMENTS

<<First Preferred Embodiment>>

Figure 1A:
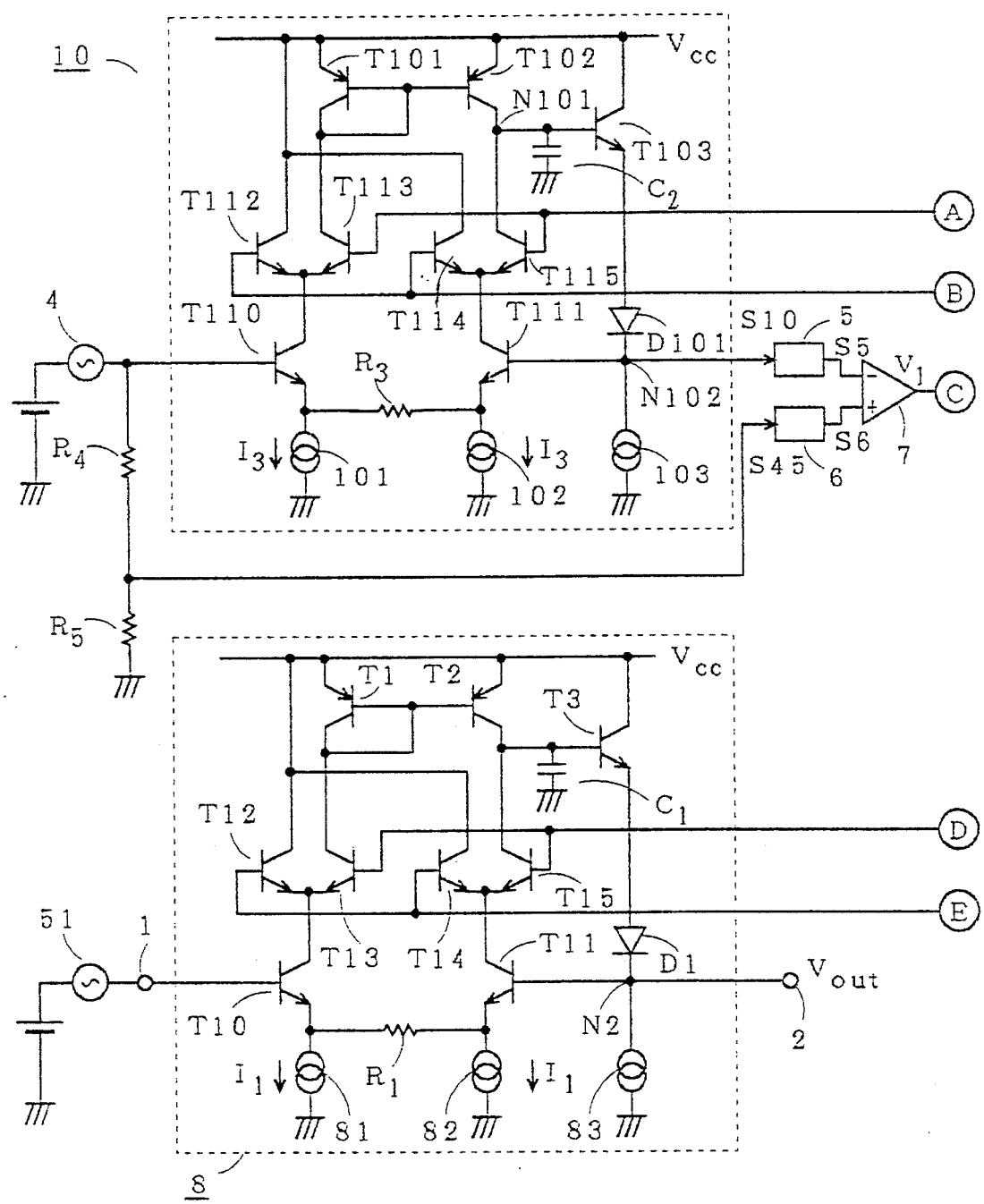
FIGS. 1A and 1B are a circuit diagram of a filter circuit according to a first preferred embodiment of the present invention.
Figure 1B:
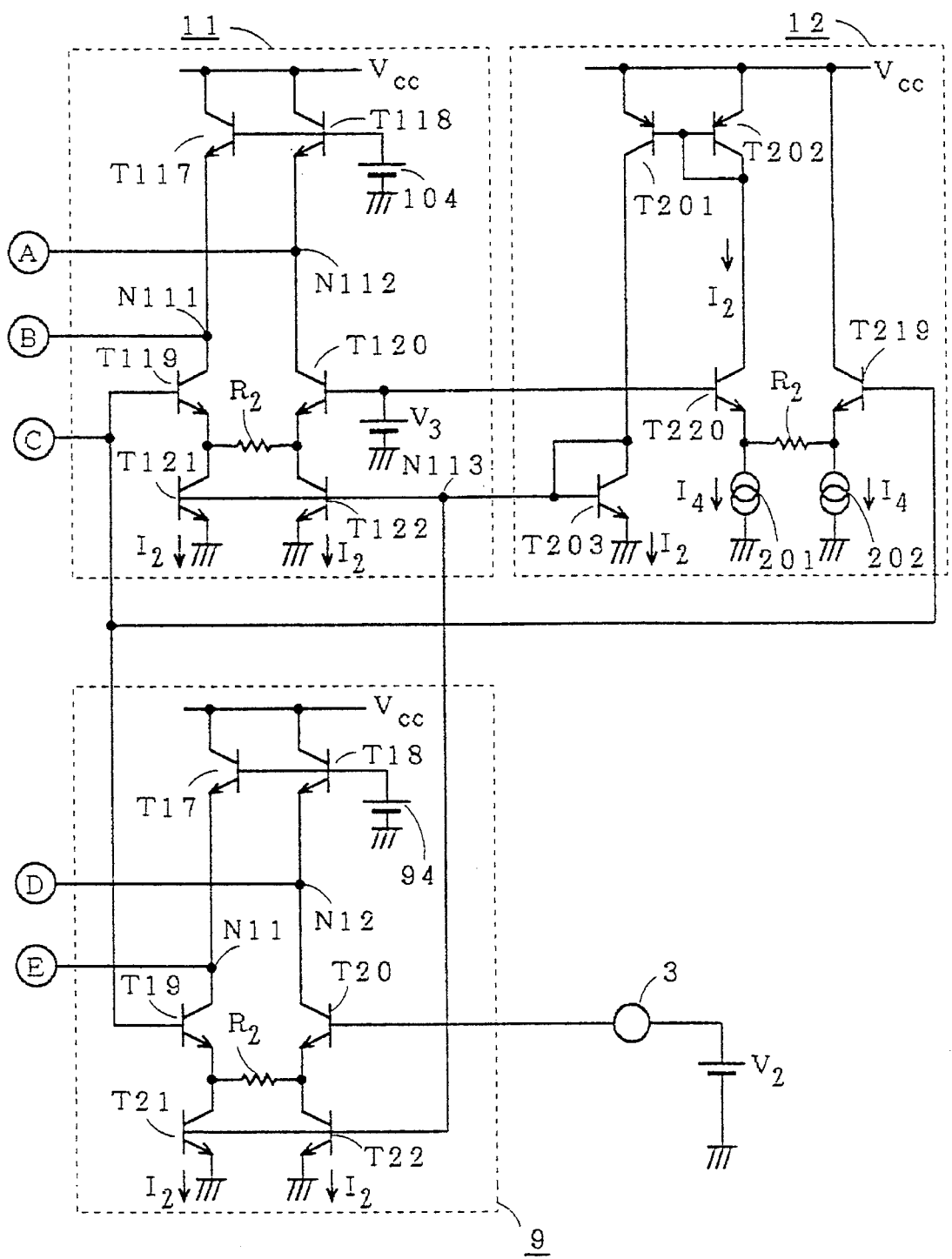
Figure 10A:
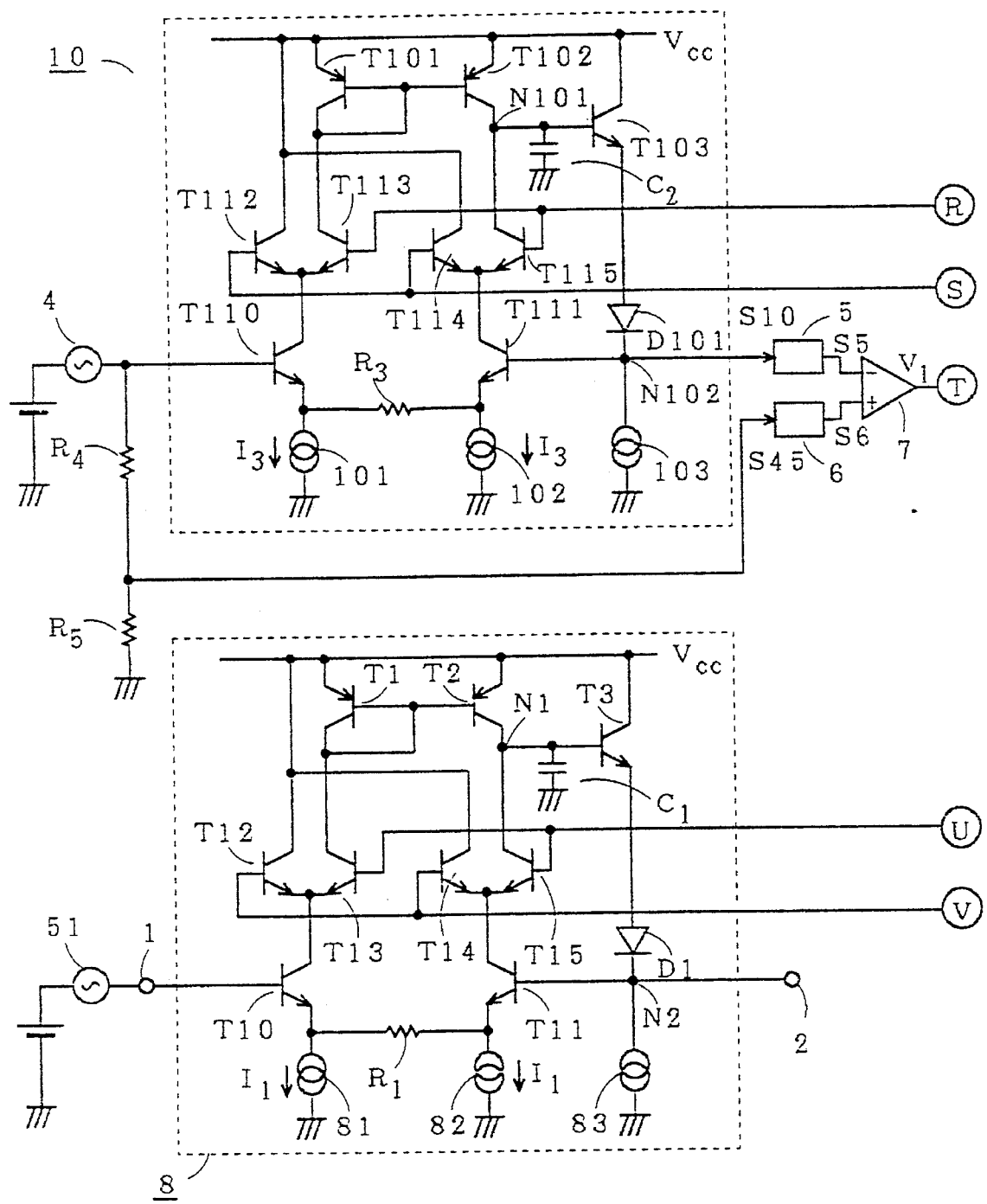
FIGS. 10A and 10B are a circuit diagram of a conventional filter circuit with automatic regulating function.
Figure 10B:
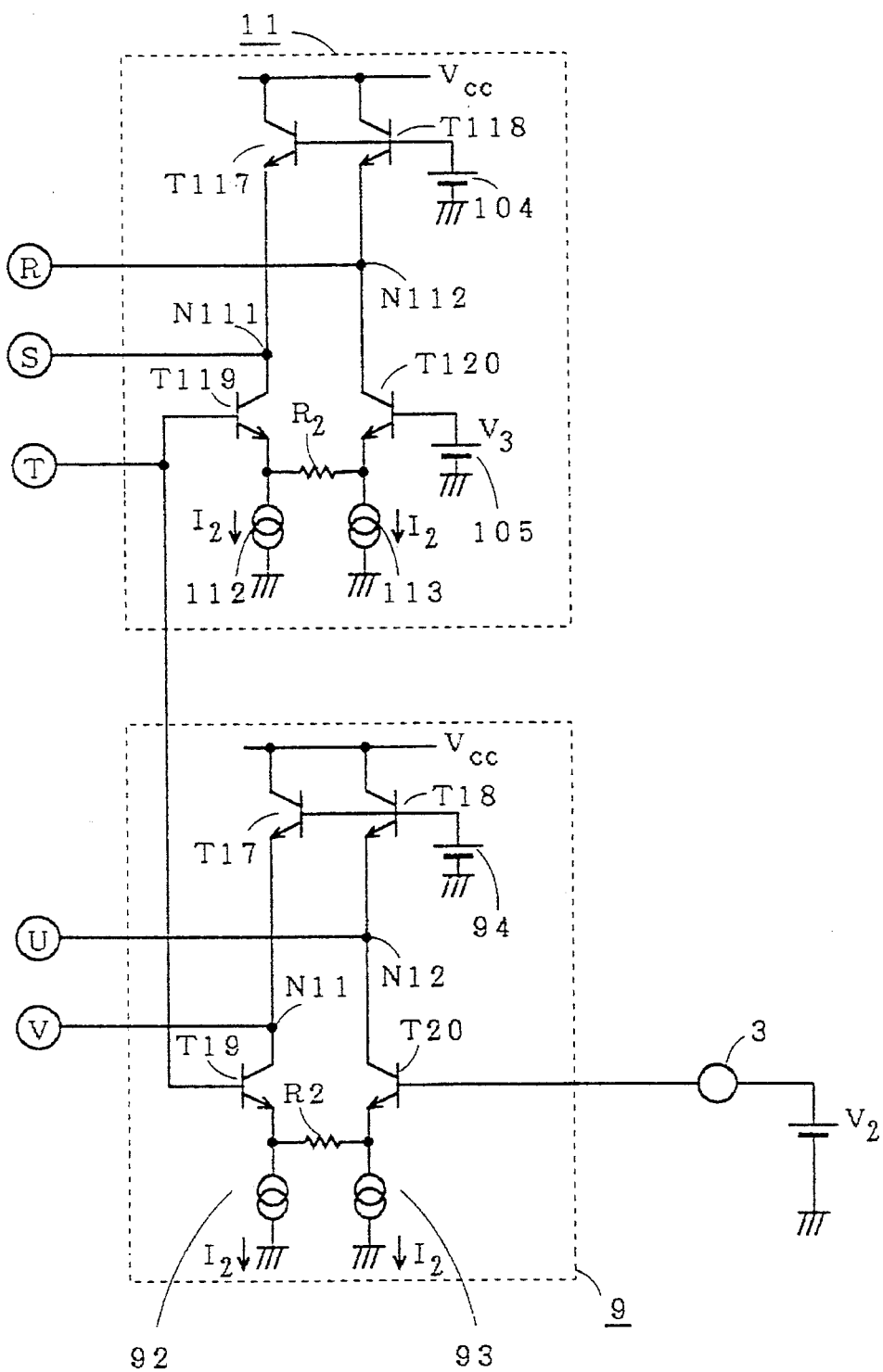

FIGS. 1A and 1B are a circuit diagram of an integrated filter circuit with automatic regulating function according to a first preferred embodiment of the present invention. In FIGS. 1A and 1B, an input terminal 1, an input signal source 51, an output terminal 2, a reference signal source 4, an operational amplifier 7, a filter portion 8, a reference filter portion 10, and resistors $R_4$ and $R_5$ are similar in construction to those of the background art shown in FIGS. 10A and 10B, and the description thereof will be omitted herein.

<Amplitude Detector>

Figure 2:
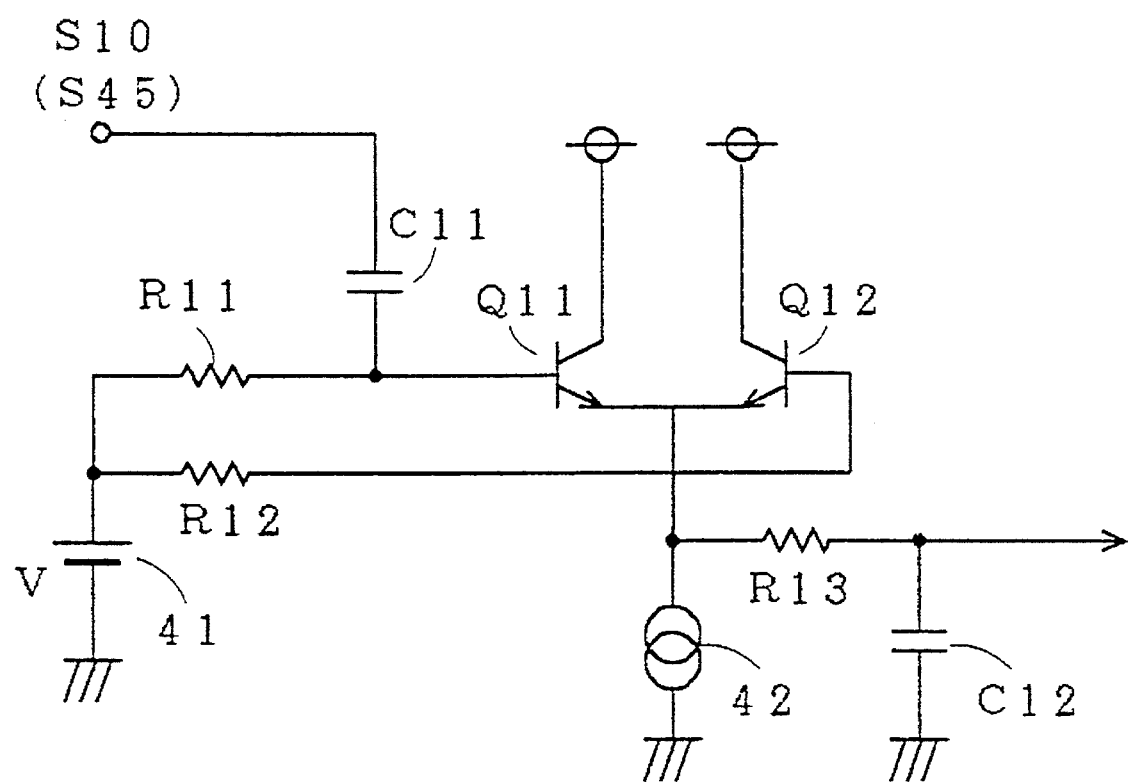
FIG. 2 is a circuit diagram of an amplitude detector shown in FIG. 1.

FIG. 2 is a circuit diagram of an amplitude detector 5 (6). As shown in FIG. 2, the amplitude detector 5 (6) includes NPN bipolar transistors Q11, Q12, resistors R11, R12, R13, capacitors C11, C12, a reference voltage source 41, and a reference current source 42. The transistors Q11 and Q12 form a differential pair. The transistor Q11 receives an output signal S10 (damped signal S45) of the reference filter portion 10 through the capacitor C11 and is connected to one end of the resistor R11. The transistor Q12 is connected to one end of the resistor R12 (having the same resistance as the resistor R11). The other ends of the resistors R11 and R12 are connected to the reference voltage source 41. The transistors Q11 and Q12 have emitters grounded through the reference current source 42 and provide an output signal through a low-pass filter including the resistor R13 and the capacitor C12.

In the amplitude detector 5 as above described, when an AC output signal S10 of the reference filter portion 10 is applied to the base of the transistor Q11, with a reference voltage applied to the base of the transistor Q12, one of the transistors Q11 and Q12 which has the higher base voltage turns on, which causes the output signal S10 to be half-wave rectified. Further, the low-pass filter including the resistor R13 and capacitor C12 removes AC components from the half-wave rectified output signal S10 to provide an output signal S5 (S6) to a negative input (positive input) of the operational amplifier 7.

<Feature of Construction>

Control portions 9 and 11 for the filter portions 8 and 10 are substantially similar in construction to those of FIG. 10 except some differences. The differences will be described below.

In the control portion 11, the emitter of a transistor T119 is grounded through an NPN bipolar transistor T121, and the emitter of a transistor T120 is grounded through an NPN bipolar transistor T122. Thus, a current $I_2$ flowing in the transistors T121 and T122 specifies the sum of the amounts of current flowing in the transistors T119 and T120.

Likewise, in the control portion 9, the emitter of a transistor T19 is grounded through a transistor T21, and the emitter of a transistor T20 is grounded through a transistor T22. Thus, the current $I_2$ flowing in the transistors T21 and T22 specifies the sum of the amounts of current flowing in the transistors T19 and T20.

The bases of the transistors T121, T122, T21, T22 are commonly connected through a node N113. It should be noted that the transistors T121 and T122 correspond to the transistors T21 and T22, respectively, and have completely the same size and characteristic as well as the same connection to their peripheral portions. Accordingly, the control portions 9 and 11 are equivalent to each other except a voltage $V_3$ (control voltage $V_2$) applied to the base of the transistor T120 (T20).

A current control portion 12 includes PNP bipolar transistors T201, T202, NPN bipolar transistors T203, T219, T220, and reference current sources 201, 202 for supplying a reference current $I_4$. The reference current $I_4$ from the reference current sources 201, 202 specifies the sum of the amounts of current flowing in the transistors T219 and T220.

The transistors T201 and T202 having emitters connected commonly to a power supply $V_{cc}$ form a current mirror circuit. The transistors T201 and T202 are of the same transistor size.

The transistors T219 and T220 form a differential pair. An output voltage $V_1$ of the operational amplifier 7 is applied to the base of the transistor T219, and the constant voltage $V_3$ is applied to the base of the transistor T220. That is, the transistors T219 and T220 are equivalent to the transistors T119 and T120 of the control portion 11, respectively.

The transistor T219 has a collector connected to the power supply $V_{cc}$ and an emitter grounded through the reference current source 202. The transistor T220 has a collector connected to the base and collector of the transistor T202, and an emitter grounded through the reference current source 201. A resistor $R_2$ (designated by the same reference character to manifest the same resistance) is connected between the emitters of the transistors T219 and T220.

The collector of the transistor T201 is connected to the collector and base of the transistor T203. The base of the transistor T203 is commonly connected to the bases of the transistors T121 and T122 of the control portion 11. The transistors T203, T121, and T122 are of the same transistor size. The transistors T203 and T121 form a current mirror circuit, and the transistors T203 and T122 form a current mirror circuit.

In such an arrangement, the current $I_2$ flowing in the respective transistors T121, T122, T21, T22 is controlled by the current control portion 12 on the basis of Expression (28).

$$I_2 = I_4 + \frac{V_3 - V_1}{R_2} \quad (28)$$

It is assumed hereinafter that the emitter resistance values of transistors being used are sufficiently small, and the current values such as $I_3$ and $I_4$ vary in inverse proportion to variations in resistances.

<Operation>

Operation will be discussed hereinafter. When the element values of the respective filter portion 8 and reference filter portion 10 are not varied but provided as designed, the cut-off frequencies $f_{10}$ and $f_8$ of the reference filter portion 10 and the filter portion 8 are determined by Expressions (29) and (30), respectively, in the same manner as the background art, and an ideal input-output characteristic thereof is provided.

$$f_{10} = \frac{1}{2\pi C_2 R_3} \left( 1 + \frac{V_1 - V_3}{I_2 R_2} \right) \quad (29)$$

$$f_8 = \frac{1}{2\pi ab C_2 R_3} \left( 1 + \frac{V_1 - V_2}{I_2 R_2} \right) = \frac{1}{ab} f_{10} + \frac{V_3 - V_2}{2\pi ab C_2 I_2 R_2 R_3} \quad (30)$$

If variations in values of elements when fabricated vary the element values such as resistances and capacitances of the elements in the reference filter portion 10 and decrease the cut-off frequency $f_{10}$ of the reference filter portion 10, the output voltage S6 of the amplitude detector 6 is not varied but the output voltage S5 of the amplitude detector 5 decreases similarly to the background art.

Consequently, the output voltage $V_1$ of the operational amplifier 7 increases, which decreases the value of the current $I_2$ controlled by the current control portion 12 from Expression (28). From Expression (29), the increased voltage $V_1$ and decreased current $I_2$ cause the cut-off frequency $f_{10}$ to increase, providing negative feedback. In this manner, the characteristic of the reference filter portion 10 is kept constant at all times similarly to the background art.

Symbols such as I and R are asterisked at upper right to indicate variations, if any, in the element values in the reference filter portion 10 (except the constant voltages such as $V_2$ and $V_3$ because they are easily designed not to vary). Then Expressions (28) to (30) are expressed as Expressions (31) to (33), respectively.

$$I_2^* = I_4^* + \frac{V_3 - V_1^*}{R_2^*} \quad (31)$$

$$f_{10}^* = \frac{1}{2\pi C_2^* R_3^*} \left( 1 + \frac{V_1^* - V_3}{I_2^* R_2^*} \right) \quad (32)$$

$$f_8^* = \frac{1}{2\pi ab C_2^* R_3^*} \left( 1 + \frac{V_1^* - V_2}{I_2^* R_2^*} \right) = \quad (33)$$

$$\frac{1}{ab} f_{10}^* + \frac{V_3 - V_2}{2\pi ab C_2^* I_2^* R_2^* R_3^*}$$

Since the input-output characteristic of the reference filter portion 10 is kept constant at all times as above described, then $f_{10}^* = f_{10}$. Expression (33) is further changed into $$f_8^* = \frac{1}{ab} f_{10} + \frac{V_3 - V_2}{2\pi ab C_2^* I_2^* R_2^* R_3^*} \quad (34)$$

Comparing Expression (30) with Expression (34), it will be understood that there is a difference in the denominator in the second term between $C_2 I_2 R_2 R_3$ and $C_2^* I_2^* R_2^* R_3^*$. By inserting Expressions (28) and (31) into Expressions (30) and (34), Expressions (30) and (34) are respectively changed into $$C_2 I_2 R_2 R_3 = C_2 \left( I_4 + \frac{V_3 - V_1}{R_2} \right) R_2 R_3 = \quad (35)$$

$$C_2 R_3 (I_4 R_2 + V_3 - V_1)$$

$$C_2^* I_2^* R_2^* R_3^* = C_2^* \left( I_4^* + \frac{V_3 - V_1^*}{R_2^*} \right) R_2^* R_3^* = \quad (36)$$

$$C_2^* R_3^* (I_4^* R_2^* + V_3 - V_1^*)$$

Since $f_{10}^* = f_{10}$, Expression (37) is derived from Expressions (29) and (32).

$$\frac{1}{2\pi C_2^* R_3^*} \left( 1 + \frac{V_1^* - V_3}{I_2^* R_2^*} \right) \stackrel{+TR}{=} \frac{1}{2\pi C_2 R_3} \left( 1 + \frac{V_1 - V_3}{I_2 R_2} \right) \quad (37)$$

Substituting $I_2$ of Expression (28) and $I_2^*$ of Expression (31) into Expression (37) and changing Expression (37) provide Expression (38).

+TR $$\frac{1}{C_2^* R_3^*} \left( 1 + \frac{V_1^* - V_3}{I_4^* R_2^* + V_3 - V_1^*} \right) = \quad (38)$$

$$\frac{1}{C_2 R_3} \left( 1 + \frac{V_1 - V_3}{I_4 R_2 + V_3 - V_1} \right)$$

$$\frac{1}{C_2^* R_3^*} \cdot \frac{I_4^* R_2^*}{I_4^* R_2^* + V_3 - V_1^*} = \frac{1}{C_2 R_3} \cdot \frac{I_4 R_2}{I_4 R_2 + V_3 - V_1}$$

From the foregoing condition that the reference current $I_4$ varies in inverse proportion to the variations in the resistance $R_2$, the equation $I_4^* R_2^* = I_4 R_2$ holds. Since numerators are equal in Expression (38), the denominators are equal, and Expression (39) holds.

$$C_2*R_3*(I_4*R_2*+V_3-V_1*)=C_2R_3(I_4R_2+V_3-V_1) \quad (39)$$

Accordingly, Expression (35) equals Expression (36) and $C_2I_2R_2R_3=C_2*I_2*R_2*R_3*$. Expression (30) equals Expression (34) and $f_8*=f_8$. If the individual element values in the filter portion 8 vary, the input-output characteristic of the filter portion 8 is kept constant independent of the value of the control voltage $V_2$ for input-output characteristic setting which is applied to the control portion 9.

<<Second Preferred Embodiment>>

Although the reference filter portion and filter portion are one-dimensional filter circuits in the first preferred embodiment, two-or-more-dimensional filter circuits may be used.

Figure 3A:
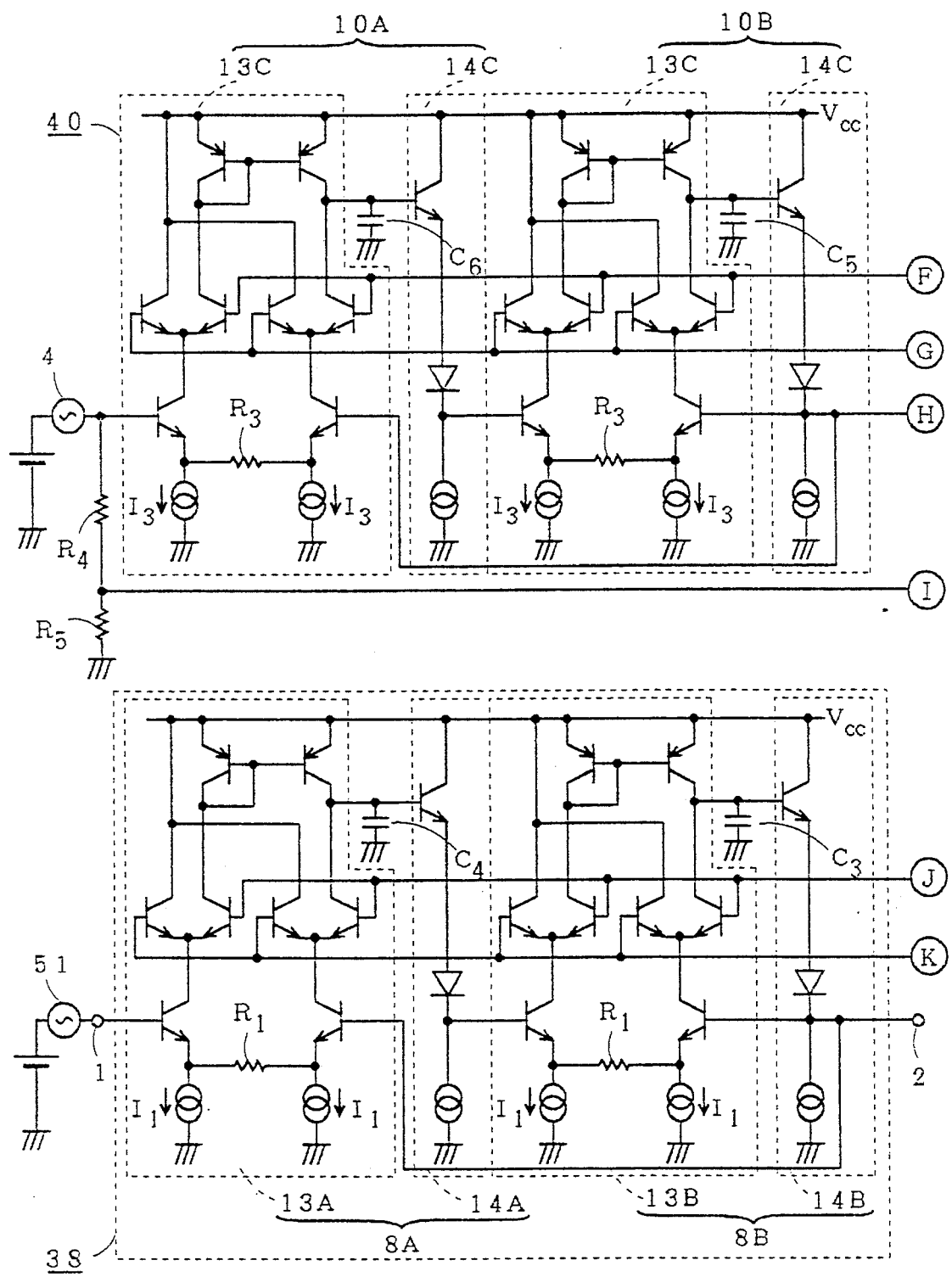
FIGS. 3A and 3B are a circuit diagram of the filter circuit according to a second preferred embodiment of the present invention.
Figure 3B:
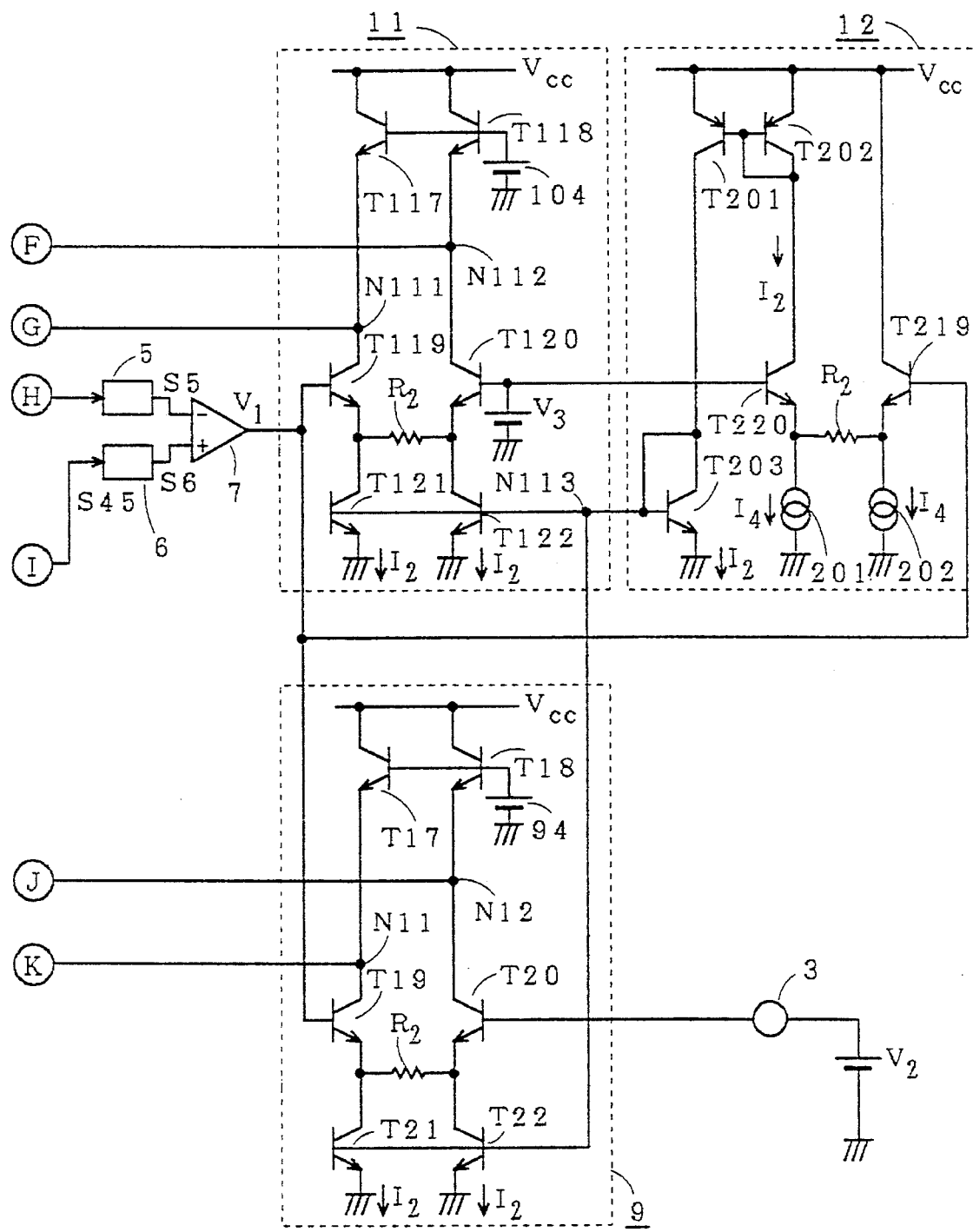
Figure 4:
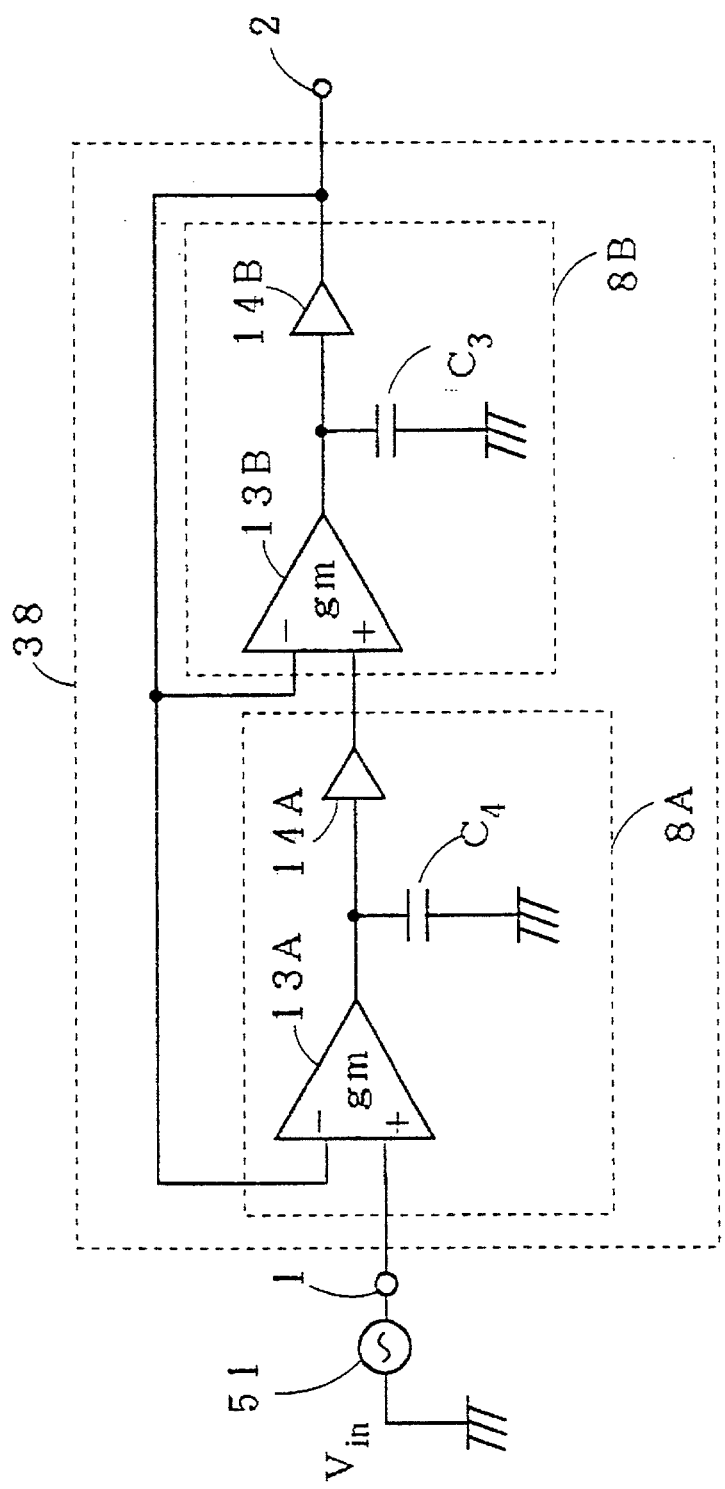
FIG. 4 schematically illustrates a filter portion shown in FIG. 3.

FIGS. 3A and 3B are a circuit diagram showing the internal construction of the integrated filter circuit using a two-dimensional filter according to a second preferred embodiment of the present invention. FIG. 4 schematically illustrates a filter portion 38.

Referring to FIG. 4, the filter portion 38 includes in-series connected partial filter portions 8A and 8B equivalent in construction to the reference filter portion 40. That is, the filter portion 38 comprises the partial filter portion 8A including a voltage-controlled current source 13A having a mutual conductance gm, a capacitor $C_4$, and a buffer 14A, and the partial filter portion 8B including a voltage-controlled current source 13B having the mutual conductance gm, a capacitor $C_3$, and a buffer 14B.

The partial filter portion 8A receives an input signal $v_{in}$ given from the input signal source 51 through the input terminal and outputs the signal to the partial filter portion 8B. The partial filter portion 8B, in turn, outputs the signal to the output terminal 2 and feeds the signal back to negative inputs of the voltage-controlled current sources 13A and 13B of the partial filter portions 8A and 8B. The input-output characteristics of the partial filter portions 8A and 8B are set by setting the capacitances of the capacitors C3 and C4 to suitable values. Since the individual partial filter portions 8A and 8B of the filter portion 38 are equivalent in construction to the filter portion 8 as above described, only the corresponding relation between the arrangement of the filter portion 38 shown in FIG. 4 and the arrangement of the filter portion 38 shown in FIGS. 3A and 3B is shown in FIGS. 3A, 3B and 4.

A reference filter portion 40 is equivalent in construction to the filter portion 38 except the resistance of the resistor $R_3$ and the capacitances of the capacitors $C_5$, $C_6$. The reference filter portion 40 comprises a partial filter portion 10A including a voltage-controlled current source 13C, the capacitor $C_6$, and a buffer 14C, and a partial filter portion 10B including a voltage-controlled current source 13C, the capacitor $C_5$, and a buffer 14C. The partial filter portion 10A is equivalent in construction to the partial filter portion 8A, and the partial filter portion 10B is equivalent in construction to the partial filter portion 8B.

The input terminal 1, input signal source 51, output terminal 2, reference signal source 4, amplitude detectors 5, 6, operational amplifier 7, control portion 9, control portion 11, current control portion 12, and resistors $R_4$, $R_5$ of the second preferred embodiment are fully similar in construction to those of the first preferred embodiment shown in FIG. 1, and the description thereof will be omitted herein.

A cut-off frequency $f_c$ of the filter circuit is generally expressed by Expression (40) independent of the degrees thereof.

$$f_c = \frac{gm}{2\pi KC} \quad (40)$$

where K is a constant determined on the basis of a capacitance ratio k of the capacitor $C_4$ to the capacitor $C_3$ of the filter portion 38.

Expression (40) corresponds to Expression (4) for the one-dimensional filter of the first preferred embodiment. An expression for gm corresponding to Expression (16) may be expressed in the same form if the voltage-controlled current source and control portion have the same form. Therefore, the filter circuit of the second preferred embodiment allows the input-output characteristic of the filter portion 38 to be kept constant on the same principle as the first preferred embodiment independent of the value of the control voltage $V_2$ for input-output characteristic setting which is applied to the control portion 9, if the individual element values in the filter portion 38 may vary.

Likewise, the expression for the cut-off frequency corresponding to Expression (40) holds for three-or-more-dimensional filters. The input-output characteristic of a multi-dimensional filter portion is kept constant on the same principle as the first preferred embodiment independent of the value of the control voltage $V_2$ for input-output characteristic setting which is applied to the control portion 9, if the individual element values in the multi-dimensional filter portion may vary.

<<Third Preferred Embodiment>>

Figure 5A:
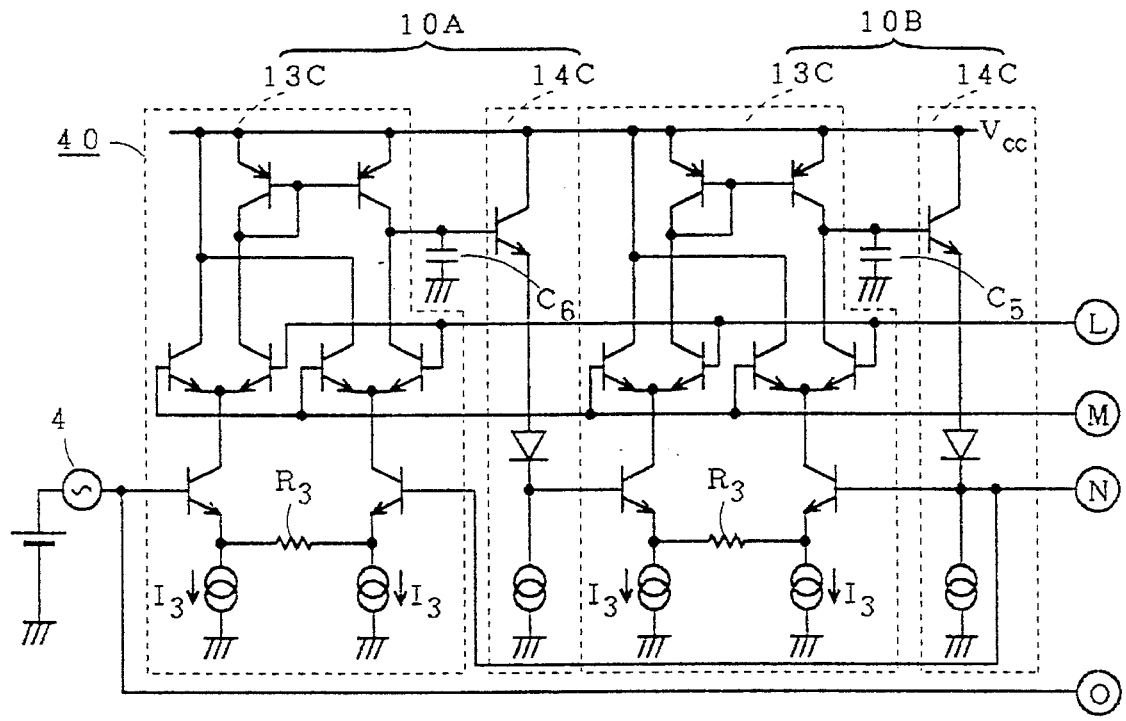
FIGS. 5A and 5B are a circuit diagram of the filter circuit according to a third preferred embodiment of the present invention.
Figure 5A:
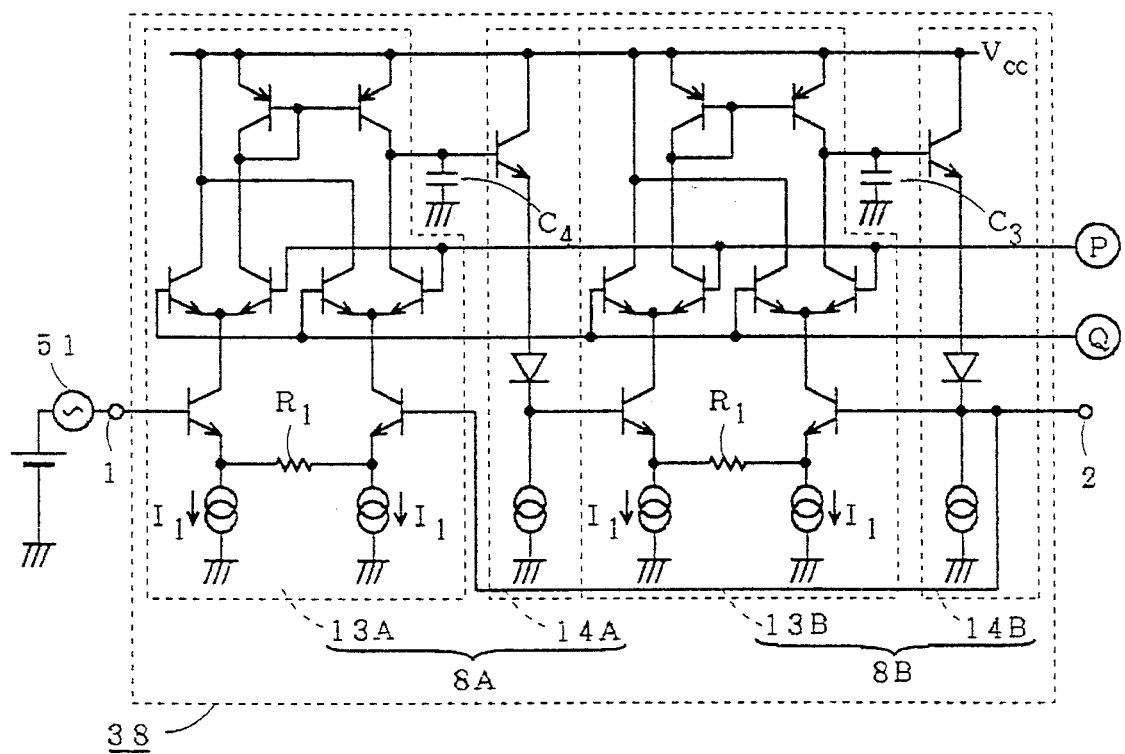
Figure 5B:
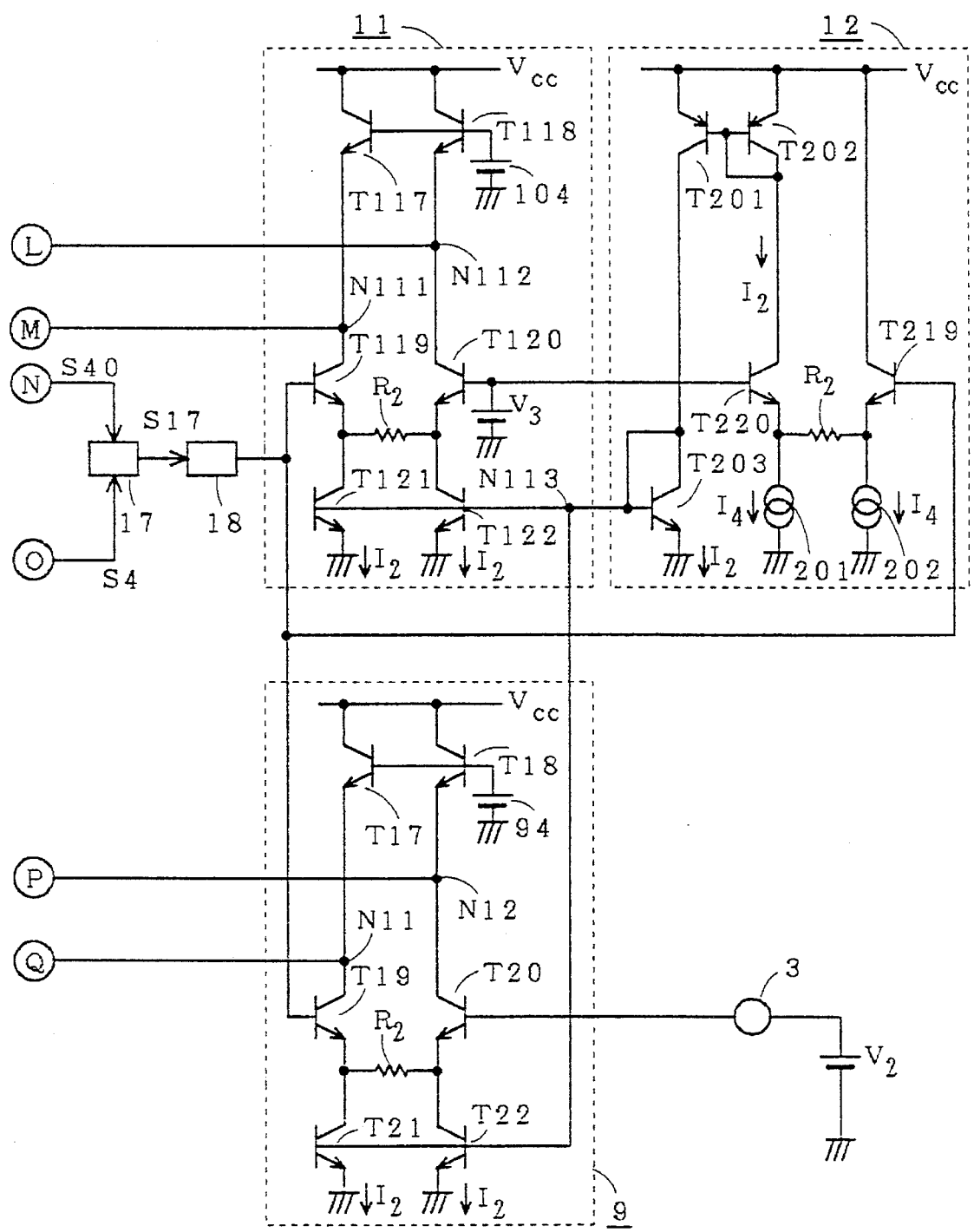

FIGS. 5A and 5B are a circuit diagram of the integrated filter circuit according to a third preferred embodiment of the present invention. As shown in FIGS. 5A and 5B, a multiplier 17 and an integrator 18 are substituted for the amplitude detectors 5, 6 and the operational amplifier 7. The resistors $R_4$ and $R_5$ for attenuation of a reference signal S4 from the reference signal source 4 are removed.

The multiplier 17 has a first input receiving an output signal S40 of the reference filter portion 40 and a second input receiving the reference signal S4, and outputs to the integrator 18 an output signal S17 which is at L level when both of the reference signal S4 and output signal S40 are higher or lower than a predetermined central voltage and which is at H level in other cases.

The integrator 18 integrates the output signal S17 to output an output voltage S18 to the bases of the transistor T119 of the control portion 11, the transistor T19 of the control portion 9, and the transistor T219 of the current control portion 12. It should be noted that the integrator 18 may be accomplished by forming an LPF (FIG. 2) including the resistor R13 and capacitor C12 of the amplitude detector 5.

The input terminal 1, input signal source 51, output terminal 2, reference signal source 4, control portion 9, control portion 11, current control portion 12, filter portion 38, and reference filter portion 40 of the third preferred embodiment are fully similar in construction to those of the second preferred embodiment shown in FIG. 4, and the description thereof will be omitted herein.

<Multiplier>

Figure 6:
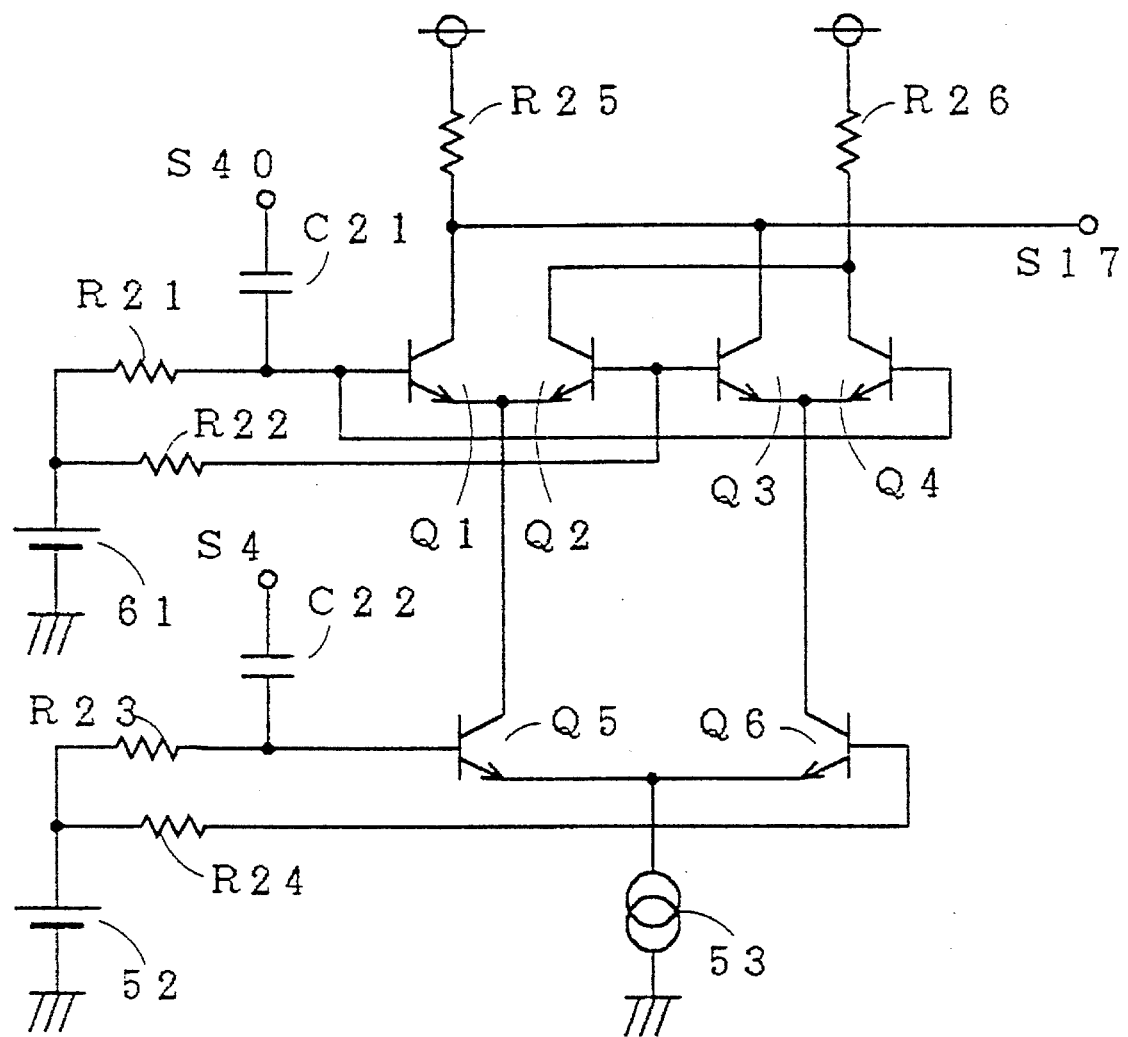
FIG. 6 is a circuit diagram of a multiplier shown in FIG. 5.

FIG. 6 is a circuit diagram of an example of the multiplier 17. As shown in FIG. 6, the multiplier 17 includes NPN bipolar transistors Q1 to Q6, resistors R21 to R26, capacitors C21, C22, reference voltage sources 61, 52, and a reference current source 53. The transistors Q1 and Q2 form a differential pair, the transistors Q3 and Q4 form a differential pair, and the transistors Q5 and Q6 form a differential pair. The collectors of the transistors Q1 and Q3 are connected to the power supply $V_{cc}$ through the resistor R25, and the collectors of the transistors Q2 and Q4 are connected to the power supply $V_{cc}$ through the resistor R26. The collector of the transistor Q5 is commonly connected to the emitters of the transistors Q1 and Q2, and the collector of the transistor Q6 is commonly connected to the emitters of the transistors Q3 and Q4. The emitters of the transistors Q5 and Q6 are connected to the reference current source 53.

A reference voltage from the reference voltage source 61 is applied to the bases of the transistors Q1 and Q4 through the resistor R21 and is applied to the bases of the transistors Q2 and Q3 through the resistor R22. The output signal S40 from the reference filter portion 40 is applied to the base of the transistor Q1 through the capacitor C21. A reference voltage from the reference voltage source 52 is applied to the base of the transistor Q5 through the resistor R23 and is applied to the base of the transistor Q6 through the resistor R24. The reference signal S4 from the reference signal source 4 is applied to the base of the transistor Q5 through the capacitor C22. Signals given from the collectors of the transistors Q1 and Q3 are the output signal S17 of the multiplier 17.

Operation of the multiplier 17 is described below. Reference voltages applied from the reference voltage sources 61, 52 are represented by VC.

In such an arrangement, when the output signal S40 is higher than the central voltage VC and the reference signal S4 is lower than the central voltage VC, the transistors Q1, Q4, Q6 are on and the transistors Q2, Q3, Q5 are off. Then there is no current flow in the resistor R25, and the output signal S17 is at H level. When the output signal S40 is higher than the central voltage VC and the reference signal S4 is higher than the central voltage VC, the transistors Q1, Q4, Q5 are on and the transistors Q2, Q3, Q6 are off. Then there is a current flow in the resistor R25, and the output signal S17 is at L level.

Figure 7:
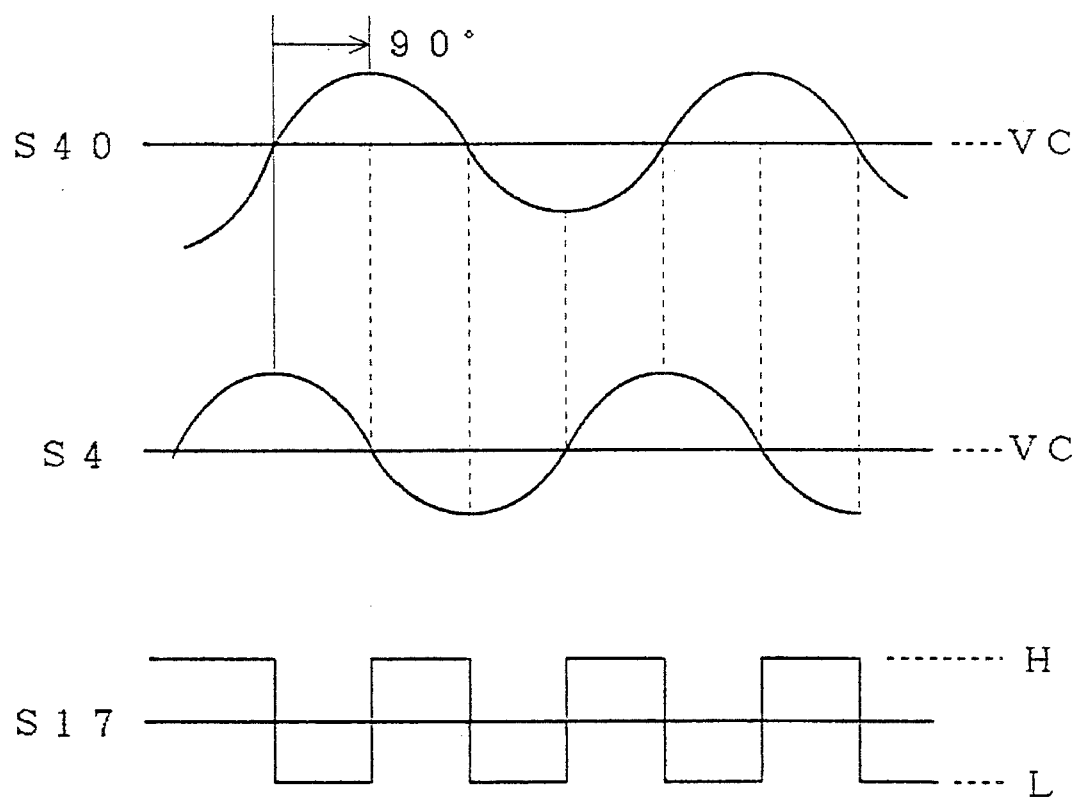
FIG. 7 is a waveform chart showing the operation of the multiplier.
Figure 8:
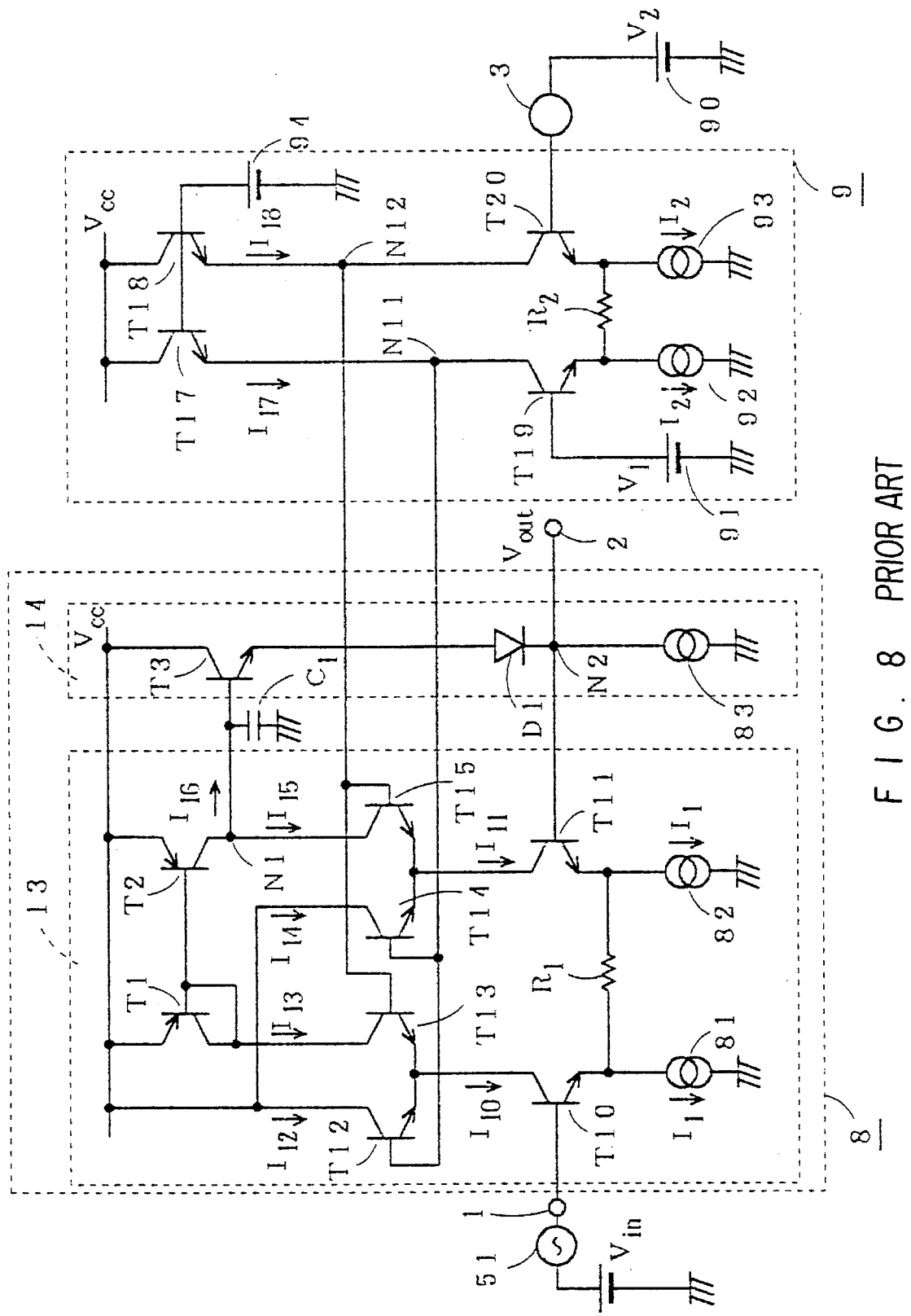
FIG. 8 is a circuit diagram of a conventional filter circuit.
Figure 9:
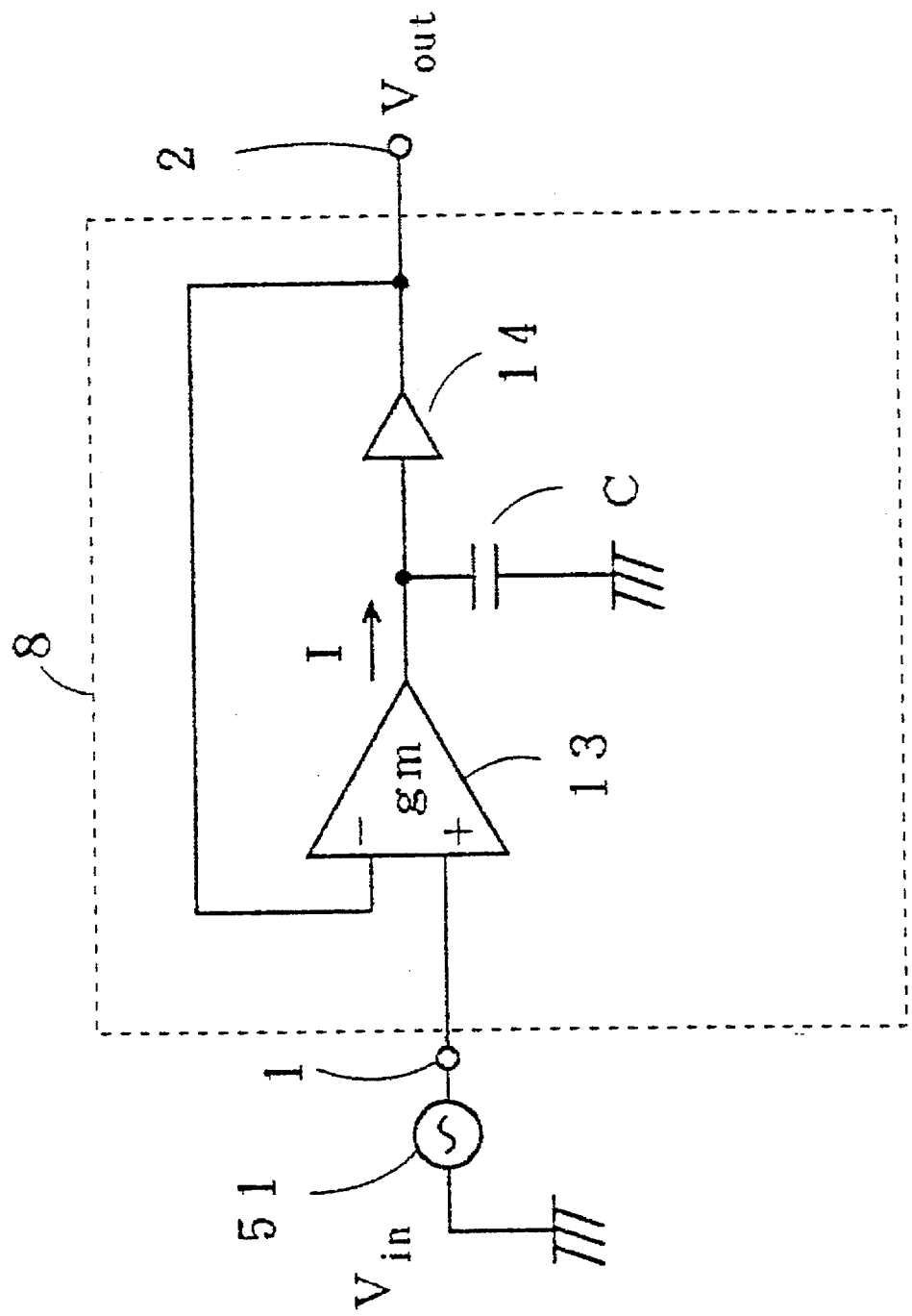
FIG. 9 schematically illustrates a filter portion shown in FIG. 8.

When the output signal S40 from the reference filter portion 40 as shown in FIG. 7, if having an ideal input-output characteristic, is designed to lag the reference signal S4 from the reference signal source 4 by a phase angle of about 90°, the multiplier 17 outputs the output signal S17 having a duty cycle of 50%. When the output signal S40 lags the reference signal S4 by a phase angle of more than 90°, the duty cycle during the H level of the output signal S17 is more than 50%. When the output signal S40 lags the reference signal S4 by a phase angle of less than 90°, the duty cycle during the H level of the output signal S17 is less than 50%.

Since the multiplier 17 outputs the output signal S17 whose H level duty cycle increases as the phase lag of the output signal S40 behind the reference signal S4 grows large, the voltage level of the output voltage S18 of the integrator 18 which is provided by integration of the output signal S17 grows higher as the phase lag grows large. Setting so that the output voltage S18 equalling the constant voltage $V_3$ is outputted when the H level duty cycle of the output signal S17 is 50%, permits the output voltage S18 to be equivalent to the output voltage $V_1$ of the operational amplifier 7 since the damping factor of the signal in the input-output characteristic of the filter is positively correlated with the phase lag.

In this manner, by setting so that the output voltage of the integrator 18 increases as the phase lag of the output signal S40 of the reference filter portion 40 grows large, the control circuit 11 functions to increase the cut-off frequency when the phase lag of the output signal S40 of the reference filter portion 40 grows large, resulting in smaller phase lag of the output signal S40. This operation is negative feedback. The output voltage S18 of the integrator 18 performs an equivalent operation to the output voltage $V_1$ of the operational amplifier 7 of the first and second preferred embodiments.

Therefore, the filter circuit of the third preferred embodiment allows the input-output characteristic of the filter portion 38 to be is kept constant on the same principle as the first and second preferred embodiments independent of the value of the control voltage $V_2$ for input-output characteristic setting which is applied to the control portion 9, if the individual element values in the filter portion 38 may vary.

While the invention has been shown and described in detail, the foregoing description is in all aspects illustrative and not restrictive. It is therefore understood that numerous modifications and variations can be devised without departing from the scope of the invention.

What is claimed is:

1. A filter circuit having a reference frequency comprising:

an input terminal receiving an input signal;

an output terminal;

an input-output characteristic control terminal receiving a control voltage;

a filter portion developing said reference frequency including a first differential amplifier circuit connected to said input terminal and said output terminal and having a differential pair of first and second transistors and a first constant current source for specifying the sum of currents flowing in said first and second transistors, and first and second frequency characteristic determining elements for specifying a first input-output characteristic, said filter portion receiving said input signal at a control electrode of one of said first and second transistors and filtering said input signal on the basis of said first input-output characteristic to output a first filtered signal at said output terminal;

a reference filter portion including a second differential amplifier circuit having a differential pair of third and fourth transistors and a second constant current source for specifying the sum of currents flowing in said third and fourth transistors, and third and fourth frequency characteristic determining elements for specifying a second input-output characteristic, said reference filter portion receiving a predetermined reference signal at a control electrode of one of said third and fourth transistors and filtering said predetermined reference signal on the basis of said second input-output characteristic to output a second filtered signal, said second differential amplifier circuit being equivalent in construction to said first differential amplifier circuit, said third and fourth transistors being similar in construction to said first and second transistors, said third frequency characteristic determining element and said first frequency characteristic determining element being of the same type, said fourth frequency characteristic determining element and said second frequency characteristic determining element being of the same type;

difference amount detecting means for comparing said second filtered signal with said predetermined reference signal to output a difference amount detection voltage indicative of the amount of difference between said second input-output characteristic of said reference filter portion and an ideal input-output characteristic desired when designed;

a reference filter control portion including a third differential amplifier circuit having a differential pair of fifth and sixth transistors and a third constant current source for specifying the sum of currents flowing in said fifth and sixth transistors, said reference filter control portion receiving said difference amount detection voltage and a predetermined reference voltage at control electrodes of said fifth and sixth transistors, respectively, and controlling said second input-output characteristic of said reference filter portion so that said difference amount detection voltage equals said reference voltage, said reference voltage being set to a level of said difference amount detection voltage at the time of said amount of difference indicating "O";

a filter control portion including a fourth differential amplifier circuit connected to said input-output characteristic control terminal and having a differential pair of seventh and eighth transistors and a fourth constant current source for specifying the sum of currents flowing in said seventh and eighth transistors, said filter control portion receiving said difference amount detection voltage and said control voltage at control electrodes of said seventh and eighth transistors, respectively, and controlling said first input-output characteristic of said filter portion so that said difference amount detection voltage equals said control voltage, said fourth differential amplifier circuit being equivalent in construction to said third differential amplifier circuit, said seventh and eighth transistors being similar in construction to said fifth and sixth transistors, respectively; and a current control portion for maintaining said reference frequency including a fifth differential amplifier circuit having a differential pair of ninth and tenth transistors and a fifth constant current source for specifying the sum of currents flowing in said ninth and tenth transistors, said current control portion forming a feedback network by receiving said difference amount detection voltage and said reference voltage at control electrodes of said ninth and tenth transistors, respectively, and automatically controlling the amount of supply current of both said third and fourth constant current sources on the basis of a potential difference between said difference amount detection voltage and said reference voltage, said fifth differential amplifier circuit being equivalent in construction to said third differential amplifier circuit, said ninth and tenth transistors being similar in construction to said fifth and sixth transistors, respectively.

2. The filter circuit of claim 1;

wherein a first electrode of one of said first and second transistors of said filter portion serves as a first output portion of said first differential amplifier circuit, and said first frequency characteristic determining element is connected between second electrodes of said first and second transistors, said second frequency characteristic determining element being connected to said first output portion; and wherein a first electrode of one of said third and fourth transistors of said reference filter portion serves as a second output portion of said second differential amplifier circuit, and said third frequency characteristic determining element is connected between second electrodes of said third and fourth transistors, said fourth frequency characteristic determining element being connected to said second output portion.

3. The filter circuit of claim 2, wherein said filter portion further includes first buffer means for amplifying a signal from said first output portion of said first differential amplifier circuit to output the amplified signal as said first filtered signal to said output terminal and to apply said first filtered signal to a control terminal of the other of said first and second transistors, and said reference filter portion includes second buffer means for amplifying a signal from said second output portion of said second differential amplifier circuit to output the amplified signal as said second filtered signal and to apply said second filtered signal to a control electrode of the other of said third and fourth transistors.

4. The filter circuit of claim 3;

wherein said first and third frequency characteristic determining elements are resistors, and said second and fourth frequency characteristic determining elements are capacitors;

wherein said first input-output characteristic is determined by resistance and capacitance of said first and second frequency characteristic determining elements; and wherein said second input-output characteristic is determined by resistance and capacitance of said third and fourth frequency characteristic determining elements.

5. The filter circuit of claim 4:

wherein said filter portion includes a plurality of in-series connected partial filter portions, said first differential amplifier circuit including a plurality of first differential amplifier circuits, said first frequency characteristic determining element including a plurality of first frequency characteristic determining elements, said second frequency characteristic determining element including a plurality of second frequency characteristic determining element;

wherein each of said plurality of partial filter portions includes one of said plurality of first differential amplifier circuits, one of said plurality of first frequency characteristic determining elements, and one of said plurality of second frequency characteristic determining elements;

wherein said first input-output characteristic is determined by resistances and capacitances of said plurality of first and second frequency characteristic determining elements;

wherein said reference filter portion includes a plurality of in-series connected partial reference filter portions, said second differential amplifier circuit including a plurality of second differential amplifier circuits, said third frequency characteristic determining element including a plurality of third frequency characteristic determining elements, said fourth frequency characteristic determining element including a plurality of fourth characteristic determining elements;

wherein each of said plurality of partial reference filter portions includes one of said plurality of second differential amplifier circuits, one of said plurality of third frequency characteristic determining elements, and one of said plurality of fourth frequency characteristic determining elements; and wherein said second input-output characteristic is determined by resistances and capacitances of said plurality of third and fourth frequency characteristic determining elements.

6. The filter circuit of claim 5, wherein said difference amount detecting means includes:

amplitude changing means for changing said predetermined reference signal by an amplitude damping factor equivalent to said ideal input-output characteristic to output an amplitude changed reference signal, and signal comparing means for comparing said amplitude changed reference signal with said second filtered signal to output said difference amount detection voltage.

7. The filter circuit of claim 6, wherein said amplitude changing means includes first and second resistors and damps said predetermined reference signal by a resistance ratio of said first resistor to said second resistor to output said amplitude changed reference signal, and wherein said signal comparing means includes:
a first amplitude detecting means for detecting the amplitude of said second filtered signal to output a first detection signal,
a second amplitude detecting means for detecting said amplitude changed reference signal to output a second detection signal, and
signal amplifying means for detecting and amplifying a potential difference between said first and second detection signals to output said difference amount detection voltage.

8. The filter circuit of claim 7, wherein said signal amplifying means outputs said difference amount detection voltage lower than said reference voltage when the potential of said first detection signal is higher than that of said second detection signal, and outputs said difference amount detection voltage higher than said reference voltage when the potential of said second detection signal is higher than that of said first detection signal, and wherein said current control portion performs control to decrease the amount of supply current of both said third and fourth constant current sources when said difference amount detection voltage is higher than said reference voltage, and performs control to increase the amount of supply current when said difference amount detection voltage is lower than said reference voltage.

9. The filter circuit of claim 5, wherein said difference amount detecting means outputs said difference amount detection voltage equal to said reference voltage on the basis of a phase difference between said predetermined reference signal and said second filtered signal when said phase difference is a desired ideal phase difference, outputs said difference amount detection voltage higher than said reference voltage when said phase difference lags said ideal phase difference, and outputs said difference amount detection voltage lower than said reference voltage when said phase difference leads said ideal phase difference.

10. The filter circuit of claim 8, wherein said difference amount detecting means includes:
multiplier means receiving said predetermined reference signal and said second filtered signal for performing digital multiplication on the basis of whether said predetermined reference signal and said second filtered signal are higher or lower than a predetermined central voltage to output a multiplied signal, and
integrator means for integrating said multiplied signal to output said difference amount detection voltage.

11. The filter circuit of claim 10, wherein said multiplier means outputs said multiplied signal at L level when both of said predetermined reference signal and said second filtered signal are higher or lower than said central voltage and outputs said multiplied signal at H level when one of said predetermined reference signal and said second filtered signal is higher than said central voltage and the other is lower, and wherein said current control portion performs control to decrease the amount of supply current of both said third and fourth constant current sources when said difference amount detection voltage is higher than said reference voltage and performs control to increase the amount of supply current when said difference amount detection voltage is lower than said reference voltage.

12. The filter circuit of claim 8, wherein said first constant current source of said filter portion includes
a first partial constant current source connected to the second electrode of said first transistor, and
a second partial constant current source connected to said second transistor, said second partial constant current source being similar in construction to said first partial constant current source, and wherein said second constant current source of said reference filter portion includes
a third partial constant current source connected to the second electrode of said third transistor, and
a fourth partial constant current source connected to the second electrode of said fourth transistor, said fourth partial constant current source being similar in construction to said third partial constant current source.

13. The filter circuit of claim 12, wherein said first to tenth transistors are bipolar transistors.

14. The filter circuit of claim 1, wherein:

said filter portion, said reference filter portion, said difference amount detecting means, said reference filter control portion, said filter control portion, said current control portion being integrally formed on the same semiconductor chip.

\* \* \* \* \*